US012671064B2

(12) United States Patent
Sarobol et al.

(10) Patent No.: US 12,671,064 B2
(45) Date of Patent: Jun. 30, 2026

(54) COMPONENT WITH PROTECTIVE SURFACE FOR PROCESSING CHAMBER

(71) Applicant: Lam Research Corporation, Fremont, CA (US)

(72) Inventors: Pylin Sarobol, Tigard, OR (US); Eric Samulon, Oakland, CA (US); Pankaj Hazarika, Sherwood, OR (US); Dennis Smith, San Jose, CA (US); Kurt Kern, Tigard, OR (US); Debanjan Das, Milpitas, CA (US); Darrell Ehrlich, San Jose, CA (US); Eric A Pape, Santa Cruz, CA (US); Matthew Brian Schick, Pflugerville, TX (US)

(73) Assignee: LAM Research Corporation, Fremont, CA (US)

( * ) Notice: Subject to any disclaimer, the term of this patent is extended or adjusted under 35 U.S.C. 154(b) by 679 days.

(21) Appl. No.: 17/794,576

(22) PCT Filed: Jan. 26, 2021

(86) PCT No.: PCT/US2021/015128
§ 371 (c)(1),
(2) Date: Jul. 21, 2022

(87) PCT Pub. No.: WO2021/154754
PCT Pub. Date: Aug. 5, 2021

(65) Prior Publication Data
US 2023/0081544 A1     Mar. 16, 2023

Related U.S. Application Data

(60) Provisional application No. 63/051,778, filed on Jul. 14, 2020, provisional application No. 62/968,015, filed on Jan. 30, 2020.

(51) Int. Cl.
*H01J 37/32* (2006.01)
*B23K 26/352* (2014.01)
(Continued)

(52) U.S. Cl.
CPC ...... *H01J 37/32477* (2013.01); *B23K 26/355* (2018.08); *H01J 37/32715* (2013.01);
(Continued)

(58) Field of Classification Search
None
See application file for complete search history.

(56) References Cited

U.S. PATENT DOCUMENTS

| | | | |
|---|---|---|---|
| 6,235,120 B1 | 5/2001 | Bang et al. | |
| 6,809,291 B1 | 10/2004 | Neil et al. | |

(Continued)

FOREIGN PATENT DOCUMENTS

| | | |
|---|---|---|
| JP | 4020957 | 10/2007 |
| JP | 2012-084848 | 4/2012 |

(Continued)

OTHER PUBLICATIONS

International Search Report from International Application No. PCT/US2021/015128 dated Aug. 5, 2021.

(Continued)

*Primary Examiner* — Ramsey Zacharia
(74) *Attorney, Agent, or Firm* — Beyer Law Group LLP

(57) ABSTRACT

A component for use inside a semiconductor chamber with a laser textured surface facing a vacuum region inside the semiconductor chamber is provided.

8 Claims, 7 Drawing Sheets

(51) Int. Cl.
    B23K 101/40         (2006.01)
    B23K 103/00         (2006.01)
    H10P 72/72          (2026.01)

(52) U.S. Cl.
    CPC ...... *B23K 2101/40* (2018.08); *B23K 2103/56*
        (2018.08); *H01J 2237/2007* (2013.01); *H01J*
            *2237/332* (2013.01); *H01J 2237/334*
            (2013.01); *H10P 72/722* (2026.01)

(56)            References Cited

U.S. PATENT DOCUMENTS

| | | | |
|---|---|---|---|
| 6,844,522 | B1 | 1/2005 | Wang et al. |
| 7,026,009 | B2 | 4/2006 | Lin et al. |
| 8,852,389 | B2 | 10/2014 | Monden et al. |
| 2004/0000540 | A1 | 1/2004 | Soboyejo et al. |
| 2007/0283884 | A1 | 12/2007 | Tiller et al. |
| 2014/0154465 | A1* | 6/2014 | Sun .................... H01L 21/6831 |
| | | | 156/89.12 |
| 2016/0265117 | A1 | 9/2016 | Maloney et al. |
| 2017/0140970 | A1* | 5/2017 | Boyd, Jr. ............ H01L 21/6833 |
| 2018/0151401 | A1 | 5/2018 | Sun et al. |
| 2018/0257172 | A1* | 9/2018 | Peng ..................... B23K 26/355 |
| 2018/0330923 | A1* | 11/2018 | Tran ........................ C23C 16/04 |
| 2019/0108988 | A1* | 4/2019 | Koch .................. H01J 37/3488 |
| 2019/0358746 | A1 | 11/2019 | Peng et al. |

FOREIGN PATENT DOCUMENTS

| | | |
|---|---|---|
| KR | 10-1095330 | 12/2011 |
| WO | 01/58374 | 8/2001 |
| WO | 02/069851 | 9/2002 |
| WO | 2005/072437 | 8/2005 |

OTHER PUBLICATIONS

Written Opinion from International Application No. PCT/US2021/015128 dated Aug. 5, 2021.

Korean Office Action from Korean Application No. 10-2022-7029921 dated Feb. 21, 2025 with Machine Translation.

* cited by examiner

COMPONENT WITH PROTECTIVE SURFACE FOR PROCESSING CHAMBER

CROSS-REFERENCE TO RELATED APPLICATION

This application claims the benefit of priority of U.S. Application No. 62/968,015, filed Jan. 30, 2020, and claims the benefit of priority of U.S. Application No. 63/051,778, filed Jul. 14, 2020 which are incorporated herein by reference for all purposes.

BACKGROUND

The disclosure relates to a plasma processing chamber for forming semiconductor devices on a semiconductor wafer.

In the formation of semiconductor devices, plasma processing chambers are used to fabricate semiconductor devices. Such plasma processing chambers may be used to etch various materials, such as conductive layers or dielectric layers. The plasma processes may react with the surfaces of the plasma processing chamber.

A protective coating may be used to protect a component of a plasma processing chamber. The plasma environment and temperature swings may cause the protective coating to delaminate from the component reducing plasma protection of the component. The delaminated protective coating and plasma interaction with the component may provide sources of contaminants.

In some plasma processing chambers, residue may deposit on surfaces of a component. The residue may flake off of the component, becoming a contaminant. Such contaminants may cause device failure.

SUMMARY

To achieve the foregoing and in accordance with the purpose of the present disclosure, a component for use inside a semiconductor chamber with a laser textured surface facing a vacuum region inside the semiconductor chamber is provided.

In another manifestation, a method for forming a component for use in a plasma processing chamber, wherein the component has a vacuum facing surface. The vacuum facing surface of the component is laser ablated to form a laser textured surface.

In another manifestation, a component for use in a plasma processing chamber is provided. A component body is of a component body material with a coeffiecient of thermal expansion (CTE). An intermediate layer is disposed over a surface of the component body, wherein the intermediate layer is a formed from a mixture of a first material with a CTE and a second material with a CTE. A protective coating of a protective coating material with a CTE is disposed on the intermediate layer, wherein the CTE of the component body material is closer to the CTE of the first material than the CTE of the second material, and where the CTE of the protective coating material is closer to the CTE of the second material than the CTE of the first material and wherein concentrations of the first material decrease in the intermediate layer going from the component body to the protective coating and concentrations of the second material increase in the intermediate layer going from the component body to the protective coating.

In another manifestation, a method for forming a component for use in a plasma processing chamber wherein the component comprises a component material with a CTE is provided. An intermediate layer is deposited over the component, wherein the intermediate layer is a formed from a mixture of a first material with a CTE and a second material with a CTE. A protective layer of a protective coating material with a CTE is deposited over the intermediate layer, wherein the CTE of the component body material is closer to the CTE of the first material than the CTE of the second material, and where the CTE of the protective coating material is closer to the CTE of the second material than the CTE of the first material and wherein the concentrations of the first material decrease in the intermediate layer going from the component body to the protective coating and concentrations of the second material increase in the intermediate layer going from the component body to the protective coating.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

During the processing of semiconductor devices, a plasma processing chamber may be used for plasma deposition, plasma etching, or for other processes used in manufacturing semiconductor devices. Such plasma processing may deposit on and/or etch surfaces of the plasma processing chamber. Components of the plasma processing chambers have surfaces used to maintain the plasma environment. Such components may be aluminum to provide electrical and thermal characteristics that are useful in maintaining the plasma. Aluminum also allows a reduction in weight and cost. A coating on the surface of the aluminum is needed to protect the aluminum surface. To minimize defects, a protective coating may be used to protect the component from degradation. The component may be aluminum, ceramics, metal matrix composites or other brittle materials that need protective coatings when used in a plasma processing chamber. Delamination of the protective coating from component may be caused by the plasma environment and the wide temperature range used in semiconductor manufacturing.

During plasma processing, residue produced by the plasma processing may be deposited on plasma-facing surfaces of components of the plasma processing chamber. If the residue does not sufficiently adhere to the plasma-facing surface, the residue may fall from the plasma-facing surface and become a contaminant during the plasma processing. In addition, the residue may create stresses on the plasma-facing surface pulling particles from the plasma-facing surface, where the particles become contaminants.

Mechanical surface roughening of a plasma-facing surface has been found to increase residue attachment. However, mechanical surface roughening has some randomness and in addition, damages the surface creating additional contaminant particles.

Figures 1, 2A:
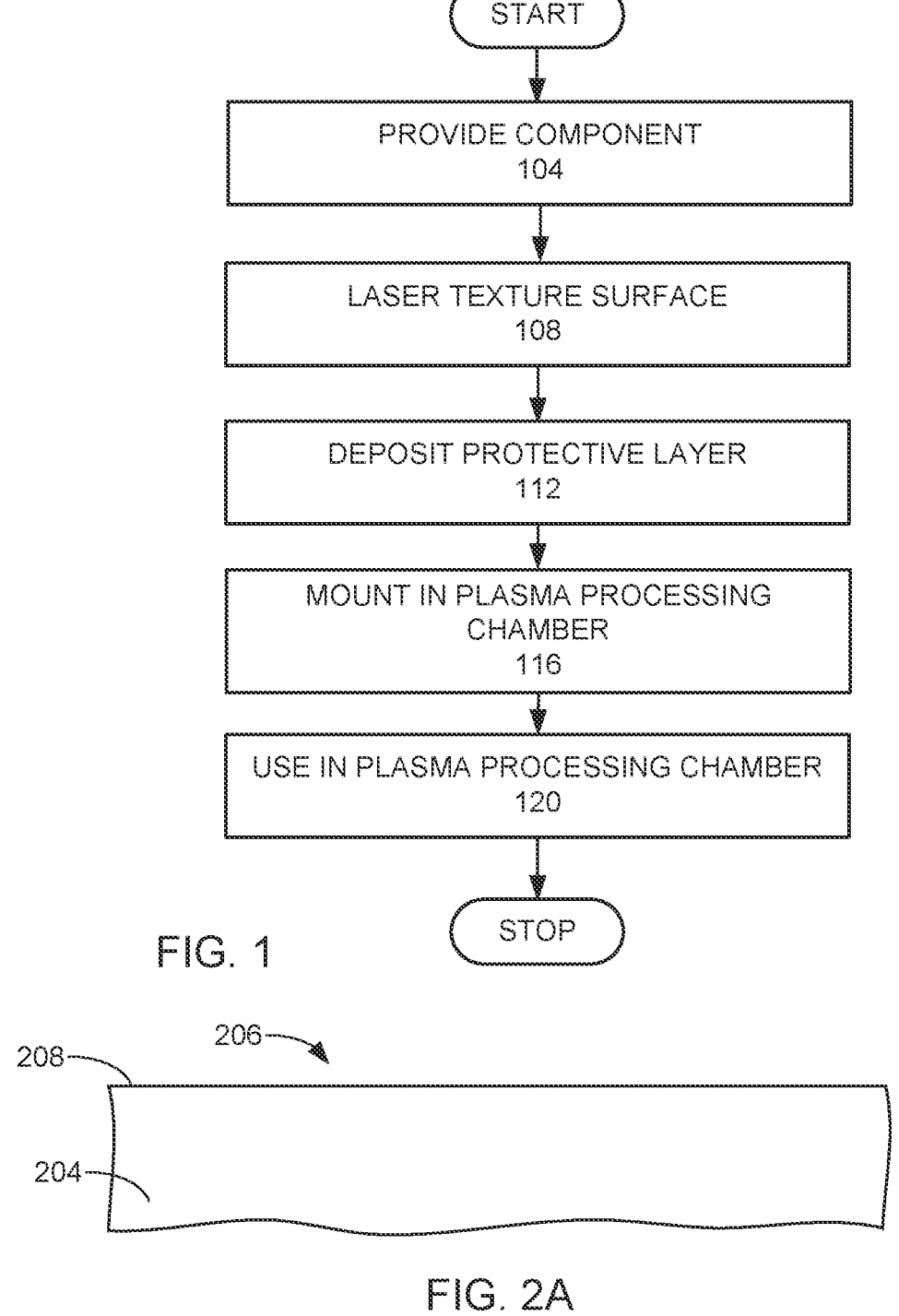
FIG. 1 is a flow chart of an embodiment.
FIGS. 2A-D are schematic cross-sectional views of a part of a component of a plasma processing chamber processed according to the embodiment shown in FIG. 1.

In an embodiment, laser texturing, or patterning, is used to increase the bond between protective coating and substrate to reduce delamination. FIG. 1 is a flow chart of an embodiment that uses laser texturing, or patterning, to increase the adhesion of the protective coating. A plasma processing chamber component is provided (step 104). FIG. 2A is a schematic cross-sectional view of part of a component 206 of a plasma processing chamber. The component 206 includes a component body 204 with a surface 208. In this embodiment, the component 206 is an aluminum component forming an electrostatic chuck (ESC) base plate.

Figure 2B:
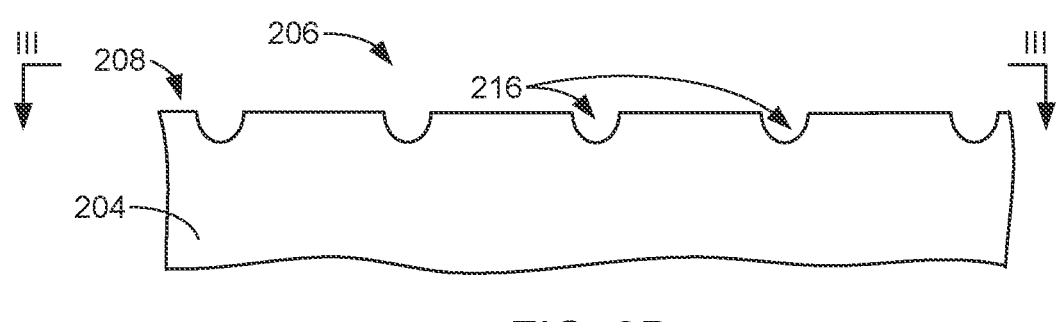
Figure 3:
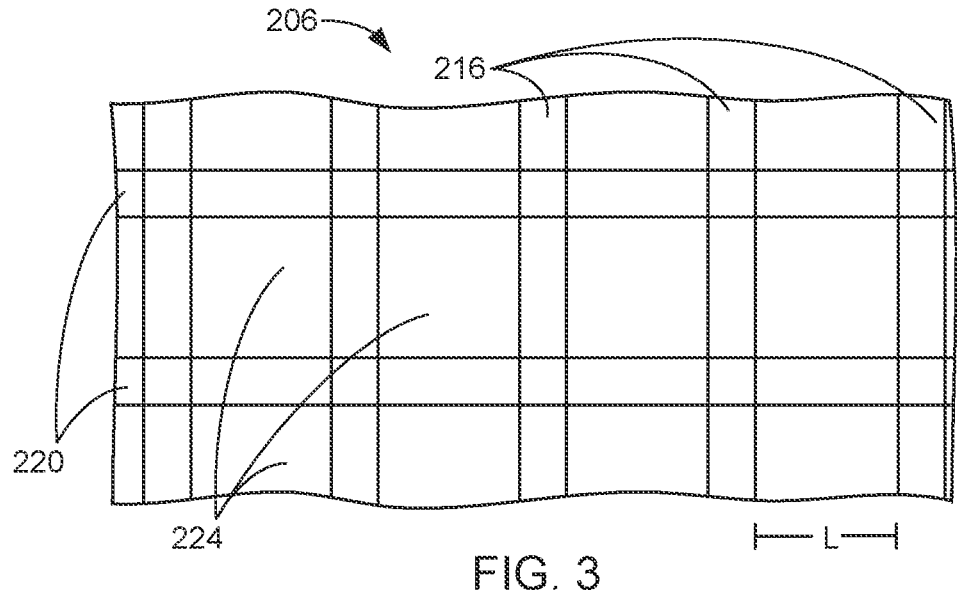
FIG. 3 is a top view of part of the component, shown in FIG. 2B.

The surface 208 of the component 206 is processed with a laser to form a laser textured, or patterned, surface (step 108). In this embodiment, laser texturing can be performed using single wavelength lasers or multi-wavelength lasers, continuous-wave lasers, or pulsed lasers. FIG. 2B is a schematic cross-sectional view of part of the component 206 after the surface 208 has been subjected to laser texturing. The laser texturing of the surface 208 creates a patterned textured surface. FIG. 3 is a top view of the component, shown in FIG. 2B along view lines III-III. The laser texturing forms a first set of parallel linear trenches 216 in a first direction and a second set of parallel linear trenches 220 in a second direction creating a cross hatched laser texture pattern. The trenches are formed through laser induced material removal. In between the cross hatched pattern, plateaus 224 are defined by the cross hatched pattern of the laser texture pattern. The laser power, pulse duration, traverse speed, spot size, and frequency may be adjusted to create different laser texturing patterns or various geometries in the 3D space. In this embodiment, the plateaus 224 have a length L in the range of 100 μm to 500 μm. In this embodiment, the laser texturing of forming plateaus 224 and the first set of parallel linear trenches 216 and the second set of parallel linear trenches 220 forms the plateaus 224 and the first set of linear trenches 216 and the second set of parallel linear trenches 220 across at least 90% of a plasma facing surface of the component 206.

Figure 2C:
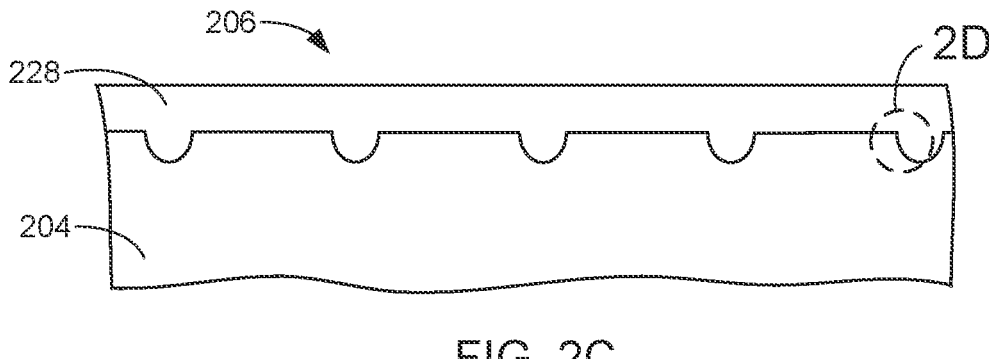

A protective layer is deposited on the patterned surface (step 112). Protective layer deposition methods include chemical or thermal treatments (anodization or plasma electrolytic oxidation), thin-film deposition (physical vapor deposition, plasma-enhanced chemical vapor deposition, chemical vapor deposition, atomic layer deposition, and electron beam deposition), thick-film deposition (thermal spray processes such as wire arc spraying, flame spraying, air plasma spraying, suspension plasma spraying, low-pressure plasma spraying, very low-pressure plasma spraying, cold spraying, kinetic energy spraying, and aerosol deposition), or laser deposition. The protective layer materials (coatings) may be oxides, rare earth oxides, fluorides, and oxyfluorides that may contain rare earth materials such as yttria, zirconia, and lanthanides. In this embodiment, the protective layer is a ceramic aluminum oxide ($Al_2O_3$) layer. FIG. 2C is a schematic cross-sectional view of part of the component 206 after a protective layer 228 has been deposited on the patterned textured surface 212. The protective layer 228 are of a material that is more plasma etch or erosion resistant than the material of the component body 204.

The component 206 is mounted in the plasma processing chamber (step 116). In this example, the component 206 with protective layer 228 is used as a coated base plate of an ESC. The component 206 as part of the ESC is used in the plasma processing chamber (step 120). In this embodiment, the ESC is subjected to an etch processing. The processing environment with high voltage bias, plasma, thermal shock, and chemical attacks may cause the degradation (erosion, cracking, etc), and delamination of the protective layer 228.

Figures 2D, 4:
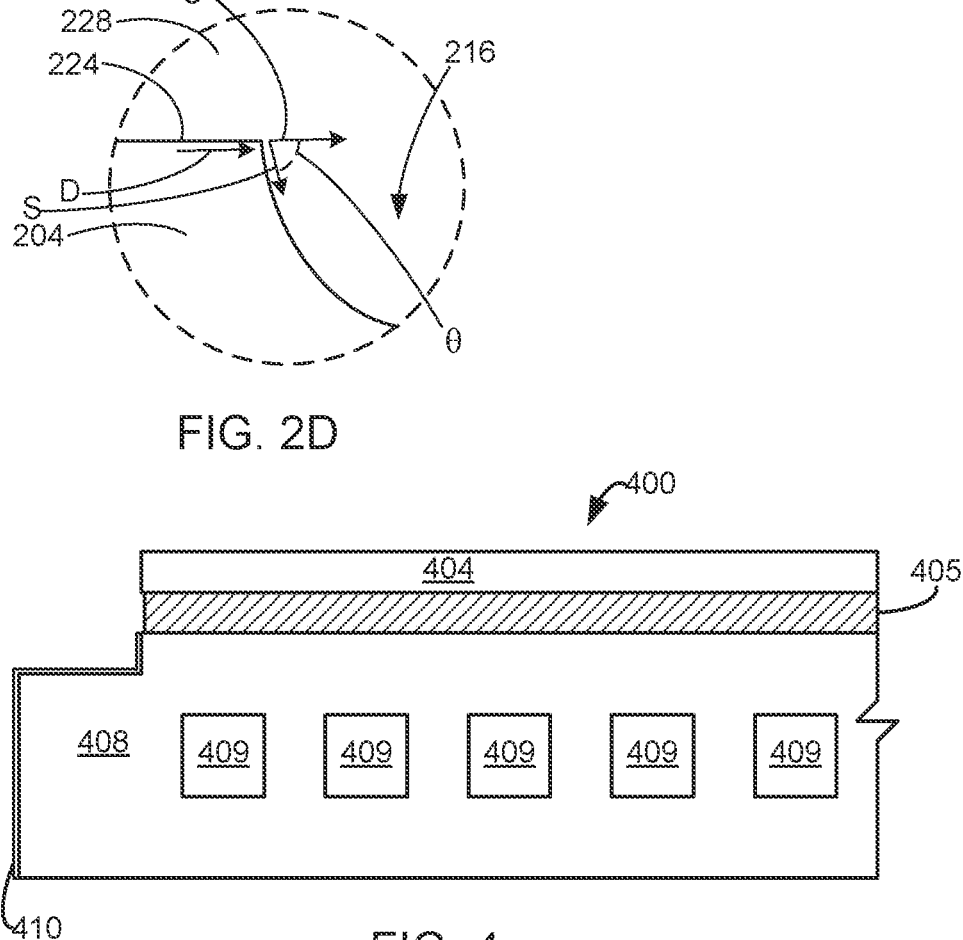
FIG. 4 is a cross-sectional schematic view of an electrostatic chuck in an embodiment.

FIG. 2D is an enlarged view of section 2D, shown in FIG. 2C. In use, variations of temperatures and other processing parameters may create a delamination crack D between the protective layer 228 and the component 206. The delamination crack D, in this example, is the separation between the protective layer 228 and the component 206. In this example, the delamination crack D propagates towards one of the first sets of parallel linear trenches 216. In order to continue the delamination between the component 206 and the protective layer 228, the delamination crack D would need to propagate along the separation arrow. Such a delamination crack D is caused by adhesive failure. Adhesive failure is caused by an interfacial crack between the protective layer 228 and the component 206. If the delamination crack D is to continue in the same direction, the delamination crack D would need to propagate along a continuation arrow C. Such a propagation would be through the protective layer 228 causing a cohesive crack, causing cohesive failure. Cohesive failure is caused by a crack passing through a material, such as through the protective layer 228. In these examples, more energy is required for the crack to change direction, following the curved interface, delaminating the protective layer from the component. Therefore, it is more energetically favorable for the crack to keep propagating in the same direction and go through the protective layer instead, resulting in the cohesive failure. Therefore, providing a surface feature allow for stronger attachment between protective layer 228 and component 206, requiring more energy/force to cause failure, and resulting in decreased adhesive failure and increased cohesive failure. In the specification and claims, surface features increasing cohesive failures are obtained through texturing, or patterning, the surface with laser processing methods.

In the specification and claims, the angle θ is called the adhesion propagation angle, defined as the angle of the directional change needed to continue the propagation of the adhesion cracking. In this example, the adhesion cracking needs to change directions from directions D and C to direction S to continue adhesive cracking between the component 206 and the protective layer 228. In the specification and claims, a critical cohesive angle is defined by the minimal adhesion propagation angle resulting in cohesive failure instead of continuing the propagation of adhesive failure. In various embodiments, the adhesion propagation angle is greater than the critical cohesive angle. In some embodiments, the adhesion propagation angle is between 45° and 120°. In various embodiments, the delamination crack will occur along continuation arrow C requiring cohesive failure, reducing delamination.

By enclosing the plateaus 224 with trench lines, also called lasers because the lines are made by lasers, so that the lengths L of the plateaus are in the range of 100 μm to 500 μm and by forming the trench lines so that the angle θ between the continuation cracking along the continuation arrow C and the separation cracking along the separation arrow S greater than the critical cohesive angle, it has been found that adhesion between the component 206 and the protective layer 228 may be increased. Laser texturing forming laser lines provides a periodic uniform texturing that is controlled by the laser parameters of laser power, pulse duration, traverse speed, spot size, frequency, etc. Such uniform texturing at the dimensions required by the embodiment with reduced surface damage cannot be achieved mechanically. The range of the lengths of the plateaus is dependent on the coating powder material and thickness of the coating. For some atomic layer deposition coatings, the length of the plateau may be in the range of 10 nm to 100 nm.

FIG. 4 is a schematic cross-sectional view illustrating an electrostatic chuck (ESC) 400 provided in an embodiment. A ceramic plate/layer 404 may be bonded by a bonding layer 405 to a base plate 408. The base plate 408 comprises Al—SiC. Al—SiC is a metal matrix composite, comprising an aluminum matrix with silicon carbide (SiC) particles. In one embodiment, the bonding layer 405 may be a polymer adhesive, such as silicone with filler particles to increase the thermal conductivity of the polymer adhesive. The base plate 408 may contain channels 409 for gas or liquid flow. These channels 409 may, for example, be formed in complex distribution channels in order to cool or heat the ESC 400. In various embodiments, the channels 409 are temperature control channels. A protective coating 410 is deposited on the sides of the base plate 408. In this example, the surface of the sides of the base plate 408 has been laser textured to increase the adhesion of the protective coating 410. In this embodiment, the protective coating 410 is of a material that is more erosion resistant to plasma than the base plate 408. At least 90% of the area plasma facing surface of the base plate 408 under the protective coating 410 is textured with plateaus 224 and the first set of parallel linear trenches 216 and the second set of parallel linear trenches 220.

In tests of various laser textured surfaces, a laser texturing is formed a cross-hatched pattern of trenches on an aluminum coupon. In some tests, the trenches were about 60 (micrometers) μm wide and 36 μm deep. The plateaus formed by the cross-hatched pattern had a length and width of about 200 μm. An aluminum oxide coating was deposited on the textured surfaced. The aluminum oxide coating was then pulled apart from the textured surface in a pull button test. This was compared to a force used to pull apart an aluminum oxide coating from a mechanically roughened aluminum coupon. It was found that it took more than three times more force to separate the aluminum oxide coating from the textured surface than the force to separate the aluminum oxide coating from the mechanically roughened surface. It was found that over the plateaus there was an adhesive failure, whereas over the trenches there was a cohesive failure. This test was conducted in accordance with ASTM C633.

In various embodiments, the critical cohesive angle is dependent on the material of the protective coating, the component, and the thickness of the protective coating. In addition, it has been found that the frequency of the trenches defined by the length and width of the plateaus also is a factor in increasing the attachment. In various embodiments, the plateau lengths can range from 10 nm to 600 μm. The plateau lengths, trench width, and trench depth would be dependent on coating thickness, deposition splat size, and substrate material properties. For example, the trench width should be greater than splat size. In addition, substrate material properties have an effect on trench spacing that is possible from laser texturing of the substrate surface. In the specification and claims, an adhesion crack length is defined as the maximum length an adhesion crack can go on a textured surface before encountering a critical cohesive angle. In the above embodiments, the adhesion crack length is defined by the length and width of the plateaus. In other embodiments, other patterning may be used instead of cross-hatching. In such embodiments, the texturing is designed to provide an adhesion crack length of less than 1 mm. In other embodiments, the adhesion crack length is less than 500 μm. In other embodiments, the adhesion crack length is less than 200 μm. In other embodiments, the adhesion crack length is less than 100 μm. In various embodiments, a plasma facing surface is patterned so that at least 90% of the plasma facing surface has an adhesion crack length of less than a specified size, such as 500 μm.

Figure 5:
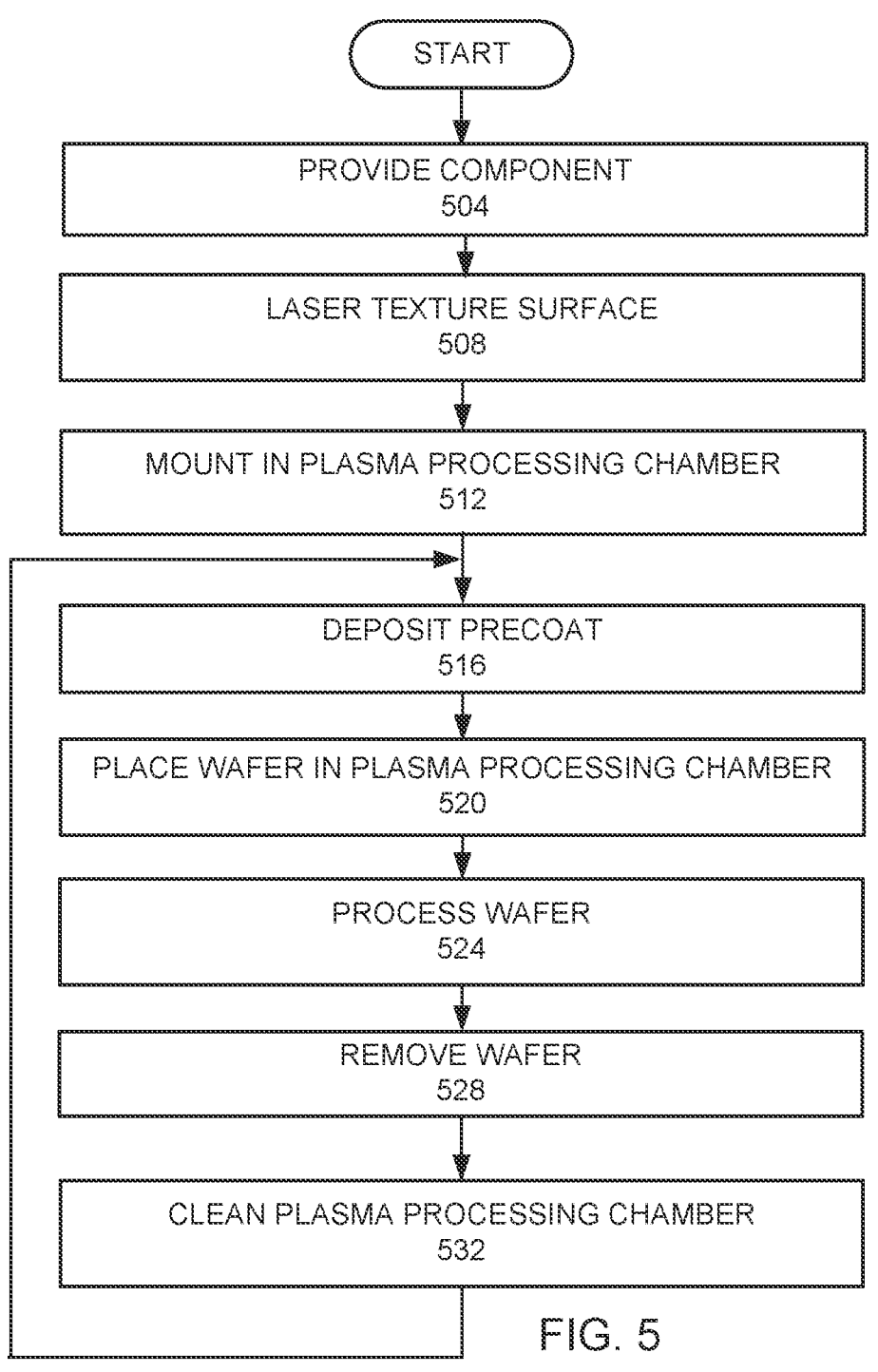
FIG. 5 is a flow chart of another embodiment.
Figures 6A, 6B, 7:
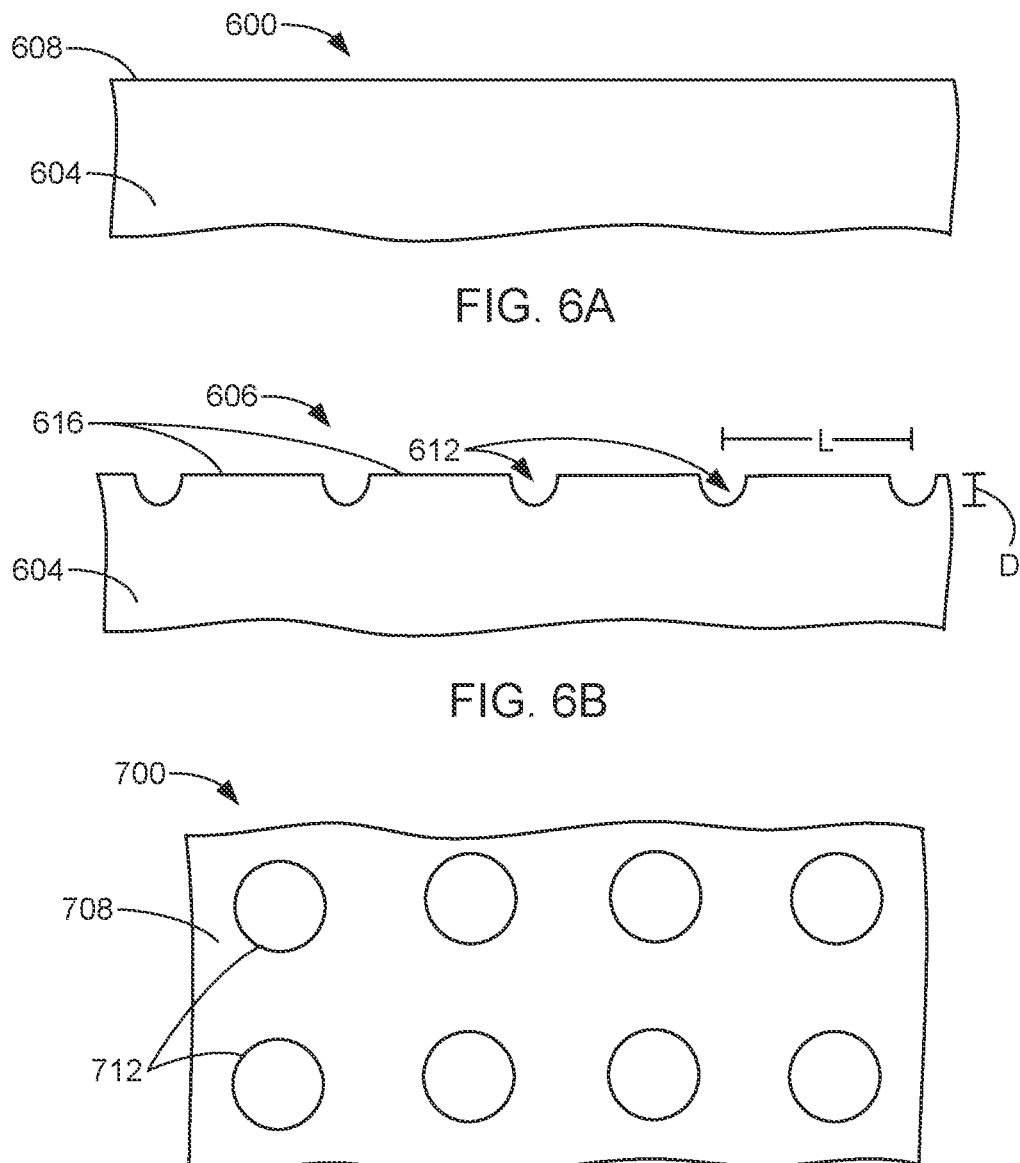
FIGS. 6A-B are schematic cross-sectional views of a part of a component of a plasma processing chamber processed according to the embodiment shown in FIG. 5.
FIG. 7 is a top view of an embodiment.

In another embodiment, laser texturing of the surface of a component may be used to increase the adhesion of plasma processing residue to the surface. To facilitate understanding, FIG. 5 is a flow chart of an embodiment. A plasma processing chamber component is provided (step 504). FIG. 6A is a schematic cross-sectional view of part of a component 600 of a plasma processing chamber. The component 600 includes a component body 604 with a plasma-facing surface 608. In this embodiment, the component 600 is an alumina component 600.

The plasma-facing surface 608 of the component body 604 is laser textured. (step 508). In this embodiment, laser texturing can be performed using single wavelength lasers or multi-wavelength lasers, continuous-wave lasers, or pulsed lasers. FIG. 6B is a schematic cross-sectional view of part of the component 600 after the component 600 has been subjected to laser ablation. In the specification and claims, laser ablation includes any method using laser energy to remove material, such vaporization, in order to change the texture of the surface, such as forming a pattern on the surface. The laser ablation serves to texture the plasma-facing surface 608, thereby creating a patterned textured surface. The patterned surface forms a pattern of laser line valleys 612 created by the laser ablation with plateaus 616 surrounded by the valleys 612. The plateaus 616 form peaks. The valleys 612 have a depth D from the bottom of a valley 612 to a top of a plateau 616. The texturing also has a valley 616 to valley 616 wavelength L. In some embodiments, the depth D is in the range of about 10 nm to 500 micrometers. In various embodiments, the wavelength L to depth D ratio is in the range between about 1:1 to 10:1. In various embodiments, the wavelength L is between 10 nm to 5000 mm.

In order to be used, the component is mounted in the plasma processing chamber (step 512). In this example, the component 606 is a showerhead for a dielectric cryogenic plasma processing chamber. In some embodiments, the dielectric cryogenic plasma processing chamber is able to provide processes at temperatures below −40° C. In other embodiments, the dielectric cryogenic plasma processing chamber is able to provide processes at temperatures below −60° C. In other embodiments, the dielectric cryogenic plasma processing chamber is able to provide processes at temperatures below either −70° C., −80° C., −90° C., or −100° C. Other embodiments use the component in an inductively coupled plasma (ICP) or transformer coupled plasma (TCP) chambers. Such chambers may be used for etching conductor layers.

A pre-coat is deposited on the plasma-facing surface 608 of the component 600 (step 516). In an embodiment, the pre-coat deposits a polymer containing layer on the plasma-facing surface 608. In alternative embodiments, the pre-coat is not deposited. A process wafer is placed in the plasma processing chamber (step 520). The process wafer is processed in the plasma processing chamber (step 524). The processing of the process wafer may be one or more of etching, deposition, bevel processing, sputtering, or other processes performed on the process wafer or on one or more layers forming a stack on the process wafer. In this embodiment, a layer of residue is deposited on the pre-coat, as a result of processing the process wafer. In some embodiments, the processing of the wafer (step 524) forms a layer of deposited residue that is between 10 nm to 5 mm thick. In some embodiments, the plasma-facing surface 608 may be subjected to a change in temperature of greater than 60° C. The process wafer is removed from the plasma processing chamber (step 528). The plasma processing chamber is cleaned (step 532). The cycle is repeated by returning to the step of depositing a pre-coat on the plasma-facing surface 608 of the component 600 (step 516). The process may be repeated for many cycles.

The laser texturing reduces residue and spalling contaminants during the processing. Spalling is the generation of particles from the surface caused by surface failure. Using laser ablation to texture the plasma-facing surface 608 of the component provides a precise and tuned texturing or pattern, instead of random texturing provided by some mechanical roughening processes. The precisely tuned plasma-facing surface 608 is tuned to increase the adhesion of the pre-coat and residue deposits. The increased adhesion reduces contaminants from falling residue deposits. In addition, the texturing may be tuned to facilitate cleaning by reducing shadowing caused by the texture.

A mechanical texturing process may cause surface damage to the plasma-facing surface 608. Damage by mechanical texturing would result in a depth of damage of greater than 0.5 micrometers. In addition, mechanical texturing may provide smear marks, where harder abrasives materials cause smears and cause plastic deformation. In addition, mechanical texturing may cause fracture points on the surface causing pointed parts, fracturing, and spalling. A subsequent annealing by the melting of such a plasma-facing surface would heal some of the damage but such an annealing would reduce some of the texturing and roughness so that that texturing provided by the mechanical process would be diminished.

For a mechanically textured surface with damage, many cycles of pre-coat deposition, residue deposition, and plasma process chamber cleaning cause stresses on the plasma facing surface. In addition, stresses are caused by the change in temperature. The various stresses over many cycles on the mechanically damaged areas of the surface create contaminant particles. The laser ablation texturing helps to prevent such damage to the microstructure. In addition, the laser ablation may anneal the plasma-facing surface 608 to remove previously caused damage. In various embodiments, the plasma-facing surface 608 has a depth of damage of less than 0.5 micrometers. Therefore, the laser ablation surface texturing provides a plasma-facing surface 608 that causes fewer contaminants.

In addition to having less damage, laser texturing provides a smoother plasma-facing surface from using a non-contact, thermal process. The laser beam has a Gaussian energy profile. There are fewer or no smear marks. In addition, laser ablation may provide micron sized patterns that are too small to produce mechanically.

In another embodiment, an inductively coupled plasma processing chamber may be used without a pre-coat layer. In an example of such an embodiment, the thickness of the deposition residue layer is between 5 nm and 60 nm, the texturing would be between 3-30 nm deep with a wavelength of 3-30 nm. The texturing may form valleys 612 as a series of parallel lines. The valleys 616 may have a depth D of about 15 nm deep and spaced apart a distance L of about 15 nm.

In another embodiment, an inductively coupled plasma processing chamber may be used with a pre-coat layer. In this embodiment, the pre-coat deposits a polymer containing layer on the plasma-facing surface with a thickness in the range of 100 nm to 800 nm thick. In an example of such an embodiment, the thickness of the deposition residue layer is between 10 nm and 15 mm, the texturing would be between 20 nm to 200 nm deep with a wavelength of 20 nm to 400 nm. Instead of the texturing providing cross hatched lines or parallel lines, the texturing may form lines that make a plurality of circles. FIG. 7 is a top view of part of a plasma-facing surface 708 of a component 700 with circles 712 formed by laser texturing. The circles 712 indicate bottoms of linear valleys that form the circumference of the circles 712. The valleys are about 10 nm deep and spaced about 50 nm apart.

In other embodiments, the texturing may form other shapes, such as pyramids with bases that are in shapes of hexagons, squares, triangles, straight parallel lines, squiggly parallel lines, cross-hatched patterns, spirals, overlapping spirals, overlapping circles, and orthogonal sets of cross-hatched parallel lines. Three sets of parallel lines may also be used to form plateaus in the shape of triangles. The patterns that are created with the orthogonal sets of parallel lines will be somewhat square. However, lasers generally have a Gaussian power and ablation profile, so these squares are not simply a step-function high/low pattern. Patterned concentric circles (i.e. 5-10 concentric circles with a maximum radius of 2 mm, abutted against a close-packed array of other patterned circles) may also be of use.

In various embodiments, the plasma-facing surface of the component may have a conductive surface, a dielectric surface, or a semiconductor surface. The plasma-facing surface may be one or more of aluminum, alumina, yttria, yttrium aluminum oxide, anodized aluminum, magnesium oxide (MgO), spinel, erbia, hafnia, different yttrium oxyfluoride compounds, compounds of magnesium, aluminum, oxygen, and yttria, and other stable or semi-stable oxides and oxyfluoride compounds of Mg, Al, or lanthanides. Preferably, the plasma-facing surface is a surface of either a ceramic part or a ceramic coating on a part. For example, the plasma-facing surface may be a surface of an alumina coating on an aluminum part. The component may form at least one of a liner, a showerhead, a gas injector, a dielectric power window, an electrode, a C-shroud liner, and a pinnacle liner.

Spalling and adhesion may be a function of the thickness and modulus of the deposition. Therefore, the patterned texture is dependent on the modulus and thickness of the material to be deposited on the plasma-facing surface.

In another embodiment, a plurality of patterns may be placed over each other to reduce the generation of particles from the surface. The reduction of generation particles from the surface is provided by at least one of increasing deposition adhesion and reducing spalling. For example, a first laser pattern may be tuned to minimize the generation of particles from the surface for a deposition of about 200 nm thick. A second laser pattern may be tuned to minimize the generation of particles from the surface for a deposition of about 500 nm thick. A third laser pattern may be tuned to minimize the generation of particles for a deposition of about 10 microns thick. Generally, the laser texturing may be provided by creating a first texture pattern tuned to prevent the generation of particles from the plasma-facing surface caused by a deposition in a first thickness range and creating a second texture pattern tuned to minimize the generation of particles from the plasma-facing surface caused by a deposition in a second thickness range and creating a third texture pattern tuned to minimize the generation of particles from the plasma-facing surface caused by a deposition in a third thickness range, where the first thickness range, the second thickness range, and the third thickness range are all different from each other.

Figure 8:
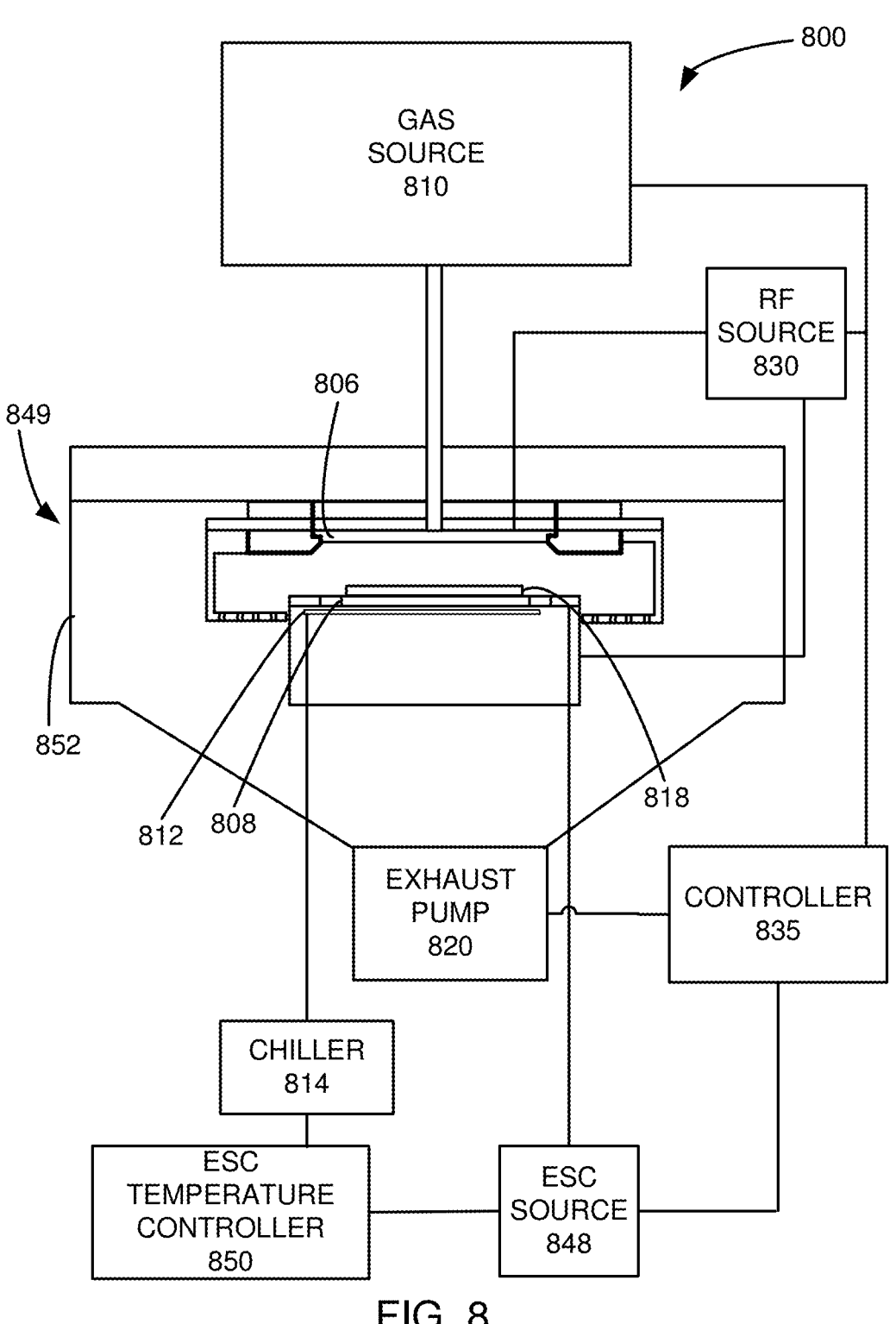
FIG. 8 is a schematic view of a plasma processing system using an embodiment.

FIG. 8 is a schematic view of an etch reactor that may be used in an embodiment. In one or more embodiments, a plasma processing system 800 comprises a gas distribution plate 806 providing a gas inlet and an electrostatic chuck (ESC) 808, within a plasma processing chamber 849, enclosed by a chamber wall 852. The plasma processing chamber 849 is a semiconductor chamber, in that the plasma processing chamber 849 is used to create semiconductor devices. Within the plasma processing chamber 849, a wafer 818 is positioned on the ESC 808. The ESC 808 may provide a bias from the ESC source 848. An etch gas source 810 is connected to the plasma processing chamber 849 through the gas distribution plate 806. An ESC temperature controller 850 is connected to a chiller 814. In this embodiment, the chiller 814 provides a coolant to channels 812 in or near the ESC 808.

A radio frequency (RF) source 830 provides RF power to a lower electrode and/or an upper electrode. In this embodiment, the lower electrode is the ESC 808 and the upper electrode is the gas distribution plate 806. In an exemplary embodiment, 400 (kilohertz) kHz, 60 megahertz (MHz), and optionally 2 MHz, 27 MHz power sources make up the RF source 830 and the ESC source 848. In this embodiment, the upper electrode is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments.

An exhaust pump 820 pumps gas from the plasma processing chamber 849, creating a vacuum within the plasma processing chamber 849. In the specification and claims, a vacuum will be defined by being at least a 99.9% vacuum with a pressure of no more than 1 torr. Parts of the plasma processing system 800 facing the vacuum within the plasma processing reactor 849, such as the ESC 808, the gas distribution plate 806, and the chamber wall 852, have surfaces that face the vacuum region within the plasma processing reactor 849. Such surfaces are vacuum facing surfaces. A controller 835 is controllably connected to the RF source 830, the ESC source 848, the exhaust pump 820, and the etch gas source 810. An example of such an etch chamber is the Exelan Flex™ etch system manufactured by Lam Research Corporation of Fremont, CA. The process chamber can be a CCP (capacitively coupled plasma) reactor or an ICP (inductively coupled plasma) reactor. Other embodiments may use other types of plasma processing chambers such as dielectric and conductive etch chambers or deposition chambers.

Figure 9:
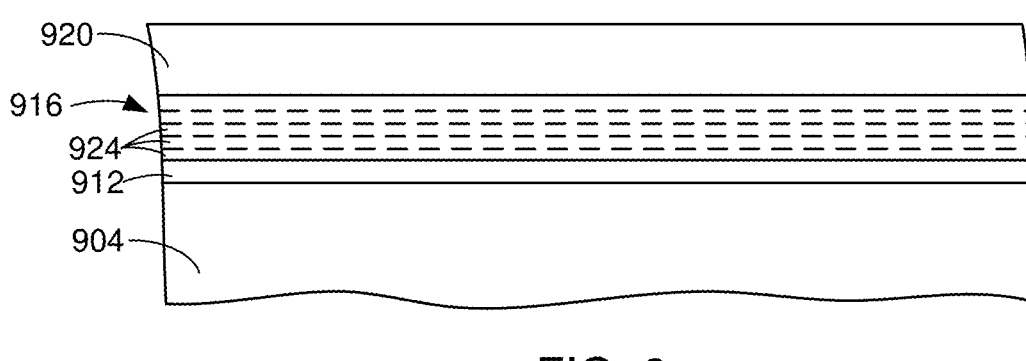
FIG. 9 is a schematic view of another embodiment.

FIG. 9 is a schematic view of another embodiment. A component body 904 may be of a substance with a CTE. In this example, the component body 904 is of aluminum. In this example, a bond coat 912 is on a surface of the component body 904. The bond coat 912 materials may be metallic/metallic alloy that is Ti-based (pure Ti, Ti alloys, etc.), Ni-based (pure Ni, Ni alloys, MCrAlY (where M is metallic element Ni, Co, etc), Mo-based (pure Mo, Mo alloys, etc), and others. In this embodiment, the bond coat adhesion layer is Ni—Al deposited by a thermal spray process. During the thermal spraying process, Ni—Al undergoes an exothermic reaction, providing superior bond strength and thus coating adhesion to the component body. An intermediate layer 916 is formed over the bond coating 912. The bond coating 912 increases the adhesion between the component body 904 and the intermediate layer 916. A protective coating 920 is formed over the intermediate layer 916. In this example, the protective coating 920 is aluminum oxide. Mixtures of elements from component body 904 materials (or other elements with CTE similar to that of the component body materials) and protective coating 920 materials are co-deposited in a series of sublayers 924 layers, each containing different volume fractions. The sublayers 924 form the intermediate layer 916. The sublayers 924 CTE will follow a rule of mixture based on volume fraction and will provide intermediate CTE between that of the substrate materials and that of the protective coating materials. For example, the component is aluminum with linear CTE of $\sim26\times10^{-6}$/K, the first intermediate layer is 75% aluminum-25% aluminum oxide, the second intermediate layer is 50% aluminum-50% aluminum oxide with a linear CTE of $\sim16.5\times10^{-6}$/K, the third intermediate layer is 25% aluminum, 75% aluminum oxide, and finally, the protective layer is aluminum oxide with a linear CTE of $\sim7\times10^{-6}$/K. In this embodiment, the sublayers 924 may be deposited using thermal spray processes, cold spray process, laser deposition, or other deposition methods.

In another embodiment, instead of the intermediate layer 916 being a plurality of sublayers 924, a mixture of elements from component body materials (or other elements with CTE similar to that of component body materials) and protective coating 920 materials are co-deposited with a linear gradation into a single intermediate layer 916. This intermediate layer 916 will provide a continuous gradation of CTE from that of the component body to that of the protective layer. For example, the component is aluminum with a linear CTE of $\sim26\times10^{-6}$/K, the intermediate layer is a mixture of aluminum and aluminum oxide. The aluminum concentration linearly decreases from 100% aluminum to 0% aluminum while aluminum oxide concentration increases from 0% aluminum oxide to 100% aluminum oxide and the protective layer is aluminum oxide with a linear CTE of $\sim7\times10^{-6}$/K. In this embodiment, the single intermediate layer 916 may be co-deposited using thermal spray processes, cold spray process, laser deposition, or other deposition methods.

In various embodiments, the intermediate layer 916 comprises a first material and a second material, wherein the material of the component body 904 has a CTE closer to the CTE of the first material than the CTE of the second material and wherein the material of the protective coating 920 has a CTE closer to the CTE of the second material than the CTE of the first material. In some embodiments, the first material is the material of the component body and the second material is the material of the protective coating 920. The intermediate layer 916 going from the component body 904 to the protective coating 920 has a decreasing concentration of the first material and an increasing concentration of the second material, such as in the two embodiments described above. In some embodiments, the intermediate layer 916 is directly on the component body 904 and there is no bonding layer 912.

Protective coating 920 deposition methods include thin-film deposition, such as physical vapor deposition, plasma-enhanced chemical vapor deposition, chemical vapor deposition, atomic layer deposition, and electron beam deposition, thick-film deposition, such as thermal spray processes such as wire arc spraying, air plasma spraying, suspension plasma spraying, low-pressure plasma spraying, very low-pressure plasma spraying, cold spraying, kinetic energy spraying, and aerosol deposition, or laser deposition. The protective coating materials may be oxides, rare earth oxides, fluorides, and oxyfluorides that may contain rare earth materials such as yttria, zirconia, and lanthanum.

In other embodiments, the intermediate layer 916 may comprise an intermediate materail with a CTE between the CTE of the material of the component body 904 and the CTE of the material of the protective coating 920. This intermediate layer 916 may comprise a material that is different from the material of the component body 904 and the material of the protective coating 920. The intermediate layer 916 may be metallic or ceramic and can be applied with any of the methods, such as thin-film deposition, such as physical vapor deposition, plasma-enhanced chemical vapor deposition, chemical vapor deposition, atomic layer deposition, and electron beam deposition, thick-film deposition, such as thermal spray processes such as wire arc spraying, air plasma spraying, suspension plasma spraying, low-pressure plasma spraying, very low-pressure plasma spraying, cold spraying, kinetic energy spraying, and aerosol deposition, or laser deposition. Examples of materials for the intermediate layer 916 in these embodiments may be zirconia-toughened alumina and yttria stabilized zirconia.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A component for use inside a semiconductor chamber, comprising:

a laser textured surface facing a vacuum region inside the semiconductor chamber; and a protective layer disposed on the laser textured surface, wherein the laser textured surface increases adhesion of the protective layer, wherein the laser textured surface has a laser texture pattern defining plateaus surrounded by laser line forming an adhesion propagation angle in a range between 45° and 120°, wherein the laser textured surface and plateaus are the same material formed in the same manner as a single part.

2. The component, as recited in claim 1, wherein the laser textured surface has a depth of damage of less than 0.5 micrometers.

3. The component, as recited in claim 1, wherein the plateaus have a length in a range of about 10 nm to 600 μm.

4. The component, as recited in claim 3, wherein the laser lines comprise a plurality of cross-hatched parallel lines spaced apart by a distance of between about 10 nm to 600 μm.

5. The component, as recited in claim 1, wherein at least 90% of the laser textured surface has an adhesion crack length of less than 500 μm.

6. The component, as recited in claim 1, wherein the plateaus have a length in a range of about 100 μm to 500 μm.

7. The component, as recited in claim 1, wherein the protective layer has a thickness greater than a depth of the laser lines.

8. The component, as recited in claim 1, wherein the protective layer completely fills the laser lines.

* * * * *